United States Patent
Mattson

(10) Patent No.: US 9,691,590 B2
(45) Date of Patent: Jun. 27, 2017

(54) SELECTIVE REMOVAL OF BORON DOPED CARBON HARD MASK LAYERS

(71) Applicant: Lam Research Corporation, Fremont, CA (US)

(72) Inventor: David T. Mattson, San Jose, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 15/177,881

(22) Filed: Jun. 9, 2016

(65) Prior Publication Data

US 2016/0379803 A1    Dec. 29, 2016

Related U.S. Application Data

(60) Provisional application No. 62/186,029, filed on Jun. 29, 2015.

(51) Int. Cl.
*H01J 37/32* (2006.01)
*H01L 21/3213* (2006.01)
*H01L 21/311* (2006.01)

(52) U.S. Cl.
CPC .... *H01J 37/32082* (2013.01); *H01J 37/3244* (2013.01); *H01L 21/31122* (2013.01); *H01L 21/31144* (2013.01); *H01L 21/32139* (2013.01)

(58) Field of Classification Search
CPC ............. H01J 37/32082; H01J 37/3244; H01J 2237/332; H01J 2237/334; H01L 21/3065; H01L 21/31122; C23C 16/50; C23C 16/45525
See application file for complete search history.

(56) References Cited

U.S. PATENT DOCUMENTS

| | | | |
|---|---|---|---|
| 7,399,712 B1 * | 7/2008 | Graff ................ | H01L 21/31144 257/E21.257 |
| 7,740,768 B1 | 6/2010 | Goto et al. | |
| 7,790,047 B2 * | 9/2010 | Huang .............. | H01L 21/31138 216/41 |
| 8,664,124 B2 * | 3/2014 | Graff ................ | H01L 21/31122 216/58 |
| 9,040,430 B2 * | 5/2015 | Nagarah ........... | H01L 21/31144 438/723 |
| 2004/0229470 A1 * | 11/2004 | Rui ..................... | H01L 21/0332 438/710 |
| 2007/0077780 A1 * | 4/2007 | Wang ................ | H01J 37/32082 438/780 |
| 2014/0213059 A1 | 7/2014 | Doan et al. | |
| 2015/0064914 A1 * | 3/2015 | Kong ................ | H01J 37/32082 438/696 |
| 2015/0126035 A1 * | 5/2015 | Diao .................... | H01J 37/321 438/710 |
| 2016/0005602 A1 * | 1/2016 | Yoo .................... | H01L 21/0338 216/41 |

* cited by examiner

*Primary Examiner* — Anita Alanko

(57) ABSTRACT

Systems and methods for processing a substrate include arranging a substrate including a film layer on a substrate support in a processing chamber. The film layer includes a boron doped carbon hard mask. A plasma gas mixture is supplied and includes molecular hydrogen, nitrogen trifluoride, and a gas selected from a group consisting of carbon dioxide and nitrous oxide. Plasma is struck in the processing chamber or supplied to the processing chamber for a predetermined stripping period. The plasma strips the film layer during the predetermined stripping period and the plasma is extinguished.

17 Claims, 3 Drawing Sheets

SELECTIVE REMOVAL OF BORON DOPED CARBON HARD MASK LAYERS

CROSS-REFERENCE TO RELATED APPLICATIONS

This application claims the benefit of U.S. Provisional Application No. 62/186,029, filed on Jun. 29, 2015. The entire disclosure of the application referenced above is incorporated herein by reference.

FIELD

The present disclosure relates to substrate processing systems and methods, and more particularly to substrate processing systems and methods for stripping boron doped carbon hard mask layers.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

During processing of substrates such as semiconductor wafers, one or more film layers are deposited on the substrates. After deposition, the layers may be patterned. During some patterning steps, a hard mask layer may be used to protect selected portions of underlying layers. After processing is complete, the hard mask layer is removed using a stripping process.

Due to shrinking feature sizes, more resilient hard mask materials are being used to protect the underlying layers. For example, boron doped carbon (BDC) hard mask layers are being used. As doping levels of boron in the hard mask layers increase, the hard mask layers become more effective at protecting the underlying layers. However, the hard mask layers also become more difficult to remove using typical plasma strip processes. Therefore, the benefits of the more resilient hard mask layers are offset by damage to the substrate that occurs when the resilient hard mask layers are removed. For example, the hard mask layers may need to be removed using aggressive strip processes using fluorine chemistry. The stripping process used to remove the hard mask layers also needs to have high selectivity to materials used in the underlying layers to prevent substrate damage.

SUMMARY

A method for processing a substrate includes arranging a substrate including a film layer on a substrate support in a processing chamber. The film layer includes a boron doped carbon hard mask. A plasma gas mixture is supplied and includes molecular hydrogen gas, nitrogen trifluoride gas and a gas selected from the group consisting of carbon dioxide and nitrous oxide. Plasma is struck in the processing chamber or supplied to the processing chamber for a predetermined stripping period. The plasma strips the film layer during the predetermined stripping period.

In other features, the plasma gas mixture includes 1% to 25% of the gas selected from the group consisting of carbon dioxide and nitrous oxide, 0.5% to 10% of the nitrogen trifluoride gas and 65% to 98.5% of the molecular hydrogen gas. The plasma gas mixture includes 2% to 8% of the gas selected from the group consisting of carbon dioxide and nitrous oxide, 0.833% to 3.33% of the nitrogen trifluoride gas and 88.66% to 97.66% of the molecular hydrogen gas. A process temperature during the predetermined stripping period is in a range from 100° C. to 300° C. A process temperature during the predetermined stripping period is in a range from 140° C. to 160° C. for residue removal and from 235° C. to 265° C. for ashing.

In other features, boron doping of the film layer is in a range from 5% to 85%. Pressure in the processing chamber is maintained in a range from 250 mTorr to 1000 mTorr during the predetermined stripping period. Pressure in the processing chamber is maintained in a range from 450 mTorr to 550 mTorr during the predetermined stripping period.

In other features, radio frequency (RF) plasma power is in a range from 1000 W to 4500 W. Radio frequency (RF) plasma power is in a range from 2750 W to 3250 W.

In other features, the film layer is arranged on a second film layer and stripping of the film layer has a selectivity ratio to the second film layer that is greater than 100:1. The film layer is arranged on a second film layer and stripping of the film layer has a selectivity ratio to the second film layer that is greater than 500:1. The film layer is arranged on a second film layer and stripping of the film layer has a selectivity ratio to the second film layer that is greater than 1000:1.

In other features, the second film layer is selected from a group consisting of an oxide film layer and a nitride film layer. The second film layer includes one of borophosphosilicate glass (BPSG), phosphosilicate glass (PSG), tungsten (W) or tungsten silicide (WSi). An ashing rate during the predetermined stripping period is in a range from 100 nm/minute to 500 nm/minute.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Substrate processing systems and methods according to the present disclosure are used to strip boron doped carbon (BDC) hard mask layers from substrates during substrate processing. Plasma is generated using a gas mixture including molecular hydrogen ($H_2$), nitrogen trifluoride ($NF_3$) and a gas selected from a group consisting of carbon dioxide ($CO_2$) and nitrous oxide ($N_2O$). The plasma process strips the BDC hard mask layers with high selectivity to underlying film layers.

Figure 1:
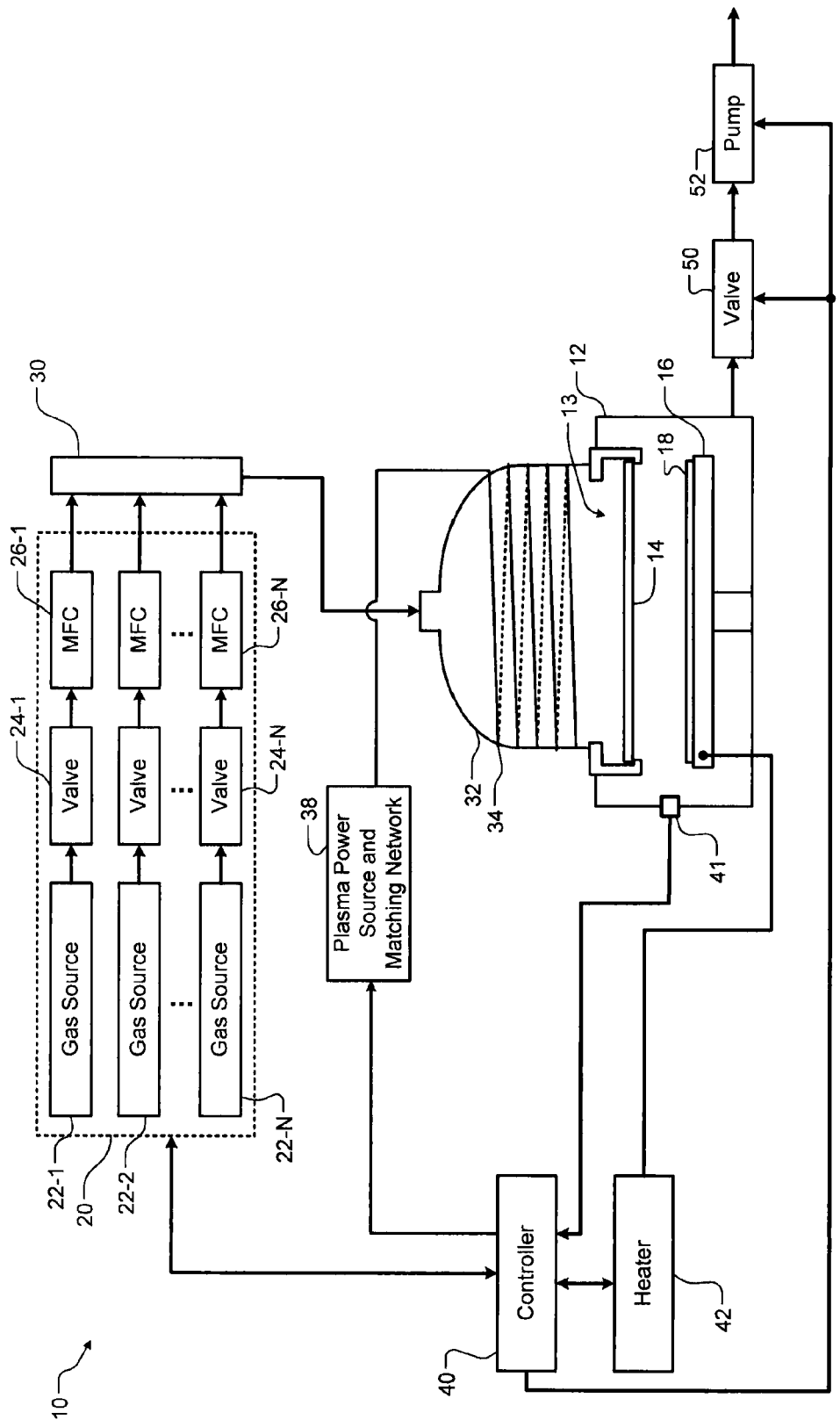
FIG. 1 is a functional block diagram of an example of a substrate processing system according to the present disclosure.

Referring now to FIG. 1, an example of a substrate processing system 10 is shown. While a specific processing chamber is shown, other types of chambers can be used. The substrate processing system 10 includes a lower chamber 12 and a gas distribution device 13 such as a faceplate or showerhead 14 including spaced through holes. In some examples, the substrate processing system 10 supplies remote or downstream plasma. A substrate support 16 may be arranged in the lower chamber 12. During use, a substrate 18 such as a semiconductor wafer or other type of substrate may be arranged on the substrate support 16.

The substrate processing system 10 includes a gas delivery system 20 to supply process gas mixtures and/or purge gas. In some examples, the gas mixture includes a predetermined mixture of $H_2$, $NF_3$ and a gas selected from a group consisting of $CO_2$ and $N_2O$. For example only, the gas delivery system 20 may include one or more gas sources 22-1, 22-2, . . . , and 22-N (collectively gas sources 22) where N is an integer greater than zero, valves 24-1, 24-2, . . . , and 24-N (collectively valves 24), and mass flow controllers (MFC) 26-1, 26-2, . . . , and 26-N (collectively MFC 26).

Outputs of the gas delivery system 20 may be mixed in a manifold 30 and delivered to an upper chamber 32 arranged above the gas distribution device 13. In some examples, the chamber 32 is domed. A plasma source includes an inductive coil 34 arranged around the upper chamber 32. A plasma power source and matching network 38 selectively supplies radio frequency (RF) or microwave (MW) plasma power to the inductive coil 34. While an inductively coupled plasma (ICP) system is shown, other types of plasma generation may be used. Alternately, the plasma may be generated directly in the processing chamber. For example only, a capacitively coupled plasma (CCP) system or any other suitable type of plasma system may be used.

A controller 40 may be connected to one or more sensors 41 that monitor operating parameters in the processing chamber 12 such as temperature, pressure, etc. A heater 42 may be provided to heat the substrate support 16 and the substrate 18 to a desired process temperature as needed. The heater 42 may include resistive heaters, fluid channels, thermo-electric devices, etc. The controller 40 controls an optional valve 50 and pump 52 to control pressure and to evacuate gas from the processing chamber 12. In some examples, the pump 52 is a turbo-molecular pump. The controller 40 may be used to control the gas delivery system 20, the heater 42, the valve 50, the pump 52, and plasma generated by the plasma source.

In some examples, the controller 40 is configured to supply a gas mixture having a predetermined ratio of gases including $H_2$, $NF_3$, and a gas selected from a group consisting of $CO_2$ and $N_2O$. The controller 40 supplies plasma to the processing chamber or strikes plasma in the processing chamber. The plasma is maintained for a predetermined period to strip the BDC hard mask layer of the substrate with little or no damage to underlying layers.

Figure 2:
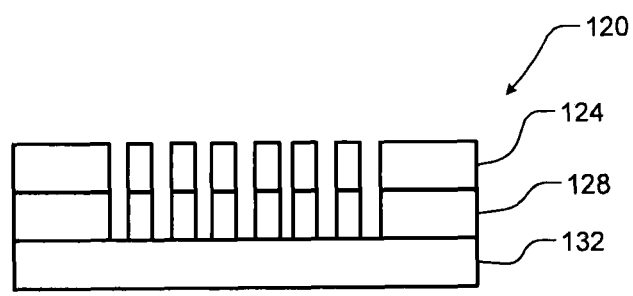
FIG. 2 is a side cross-section view of a substrate including a boron doped carbon (BDC) hard mask layer arranged on one or more underlying layers.
Figure 3:
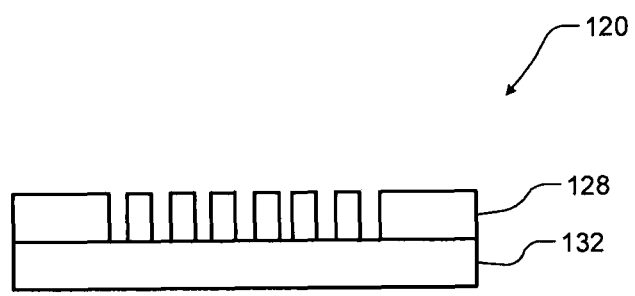
FIG. 3 is a side cross-section view of the substrate of FIG. 2 after the BDC hard mask layer is removed.

Referring now to FIGS. 2 and 3, processing of a substrate 120 is shown. In FIG. 2, the substrate 120 includes the BDC hard mask layer 124, a second layer 128 and one or more underlying substrate layers 132. The second layer 128 may include films such as oxide (such as but not limited to silicon dioxide ($SiO_2$)), nitride film (such as but not limited to silicon nitride (SiN) or silicon carbonitride (SiCN)), borophosphosilicate glass (BPSG), phosphosilicate glass (PSG), tungsten (W) or tungsten silicide (WSi). In some examples, the BDC hard mask layer 124 may be used to pattern the second layer 128. After patterning of the second layer 128 (and/or the underlying substrate layers 132) is complete, the BDC hard mask layer 124 is stripped. In FIG. 3, the BDC hard mask layer 124 is shown after stripping according to the present disclosure.

Figure 4:
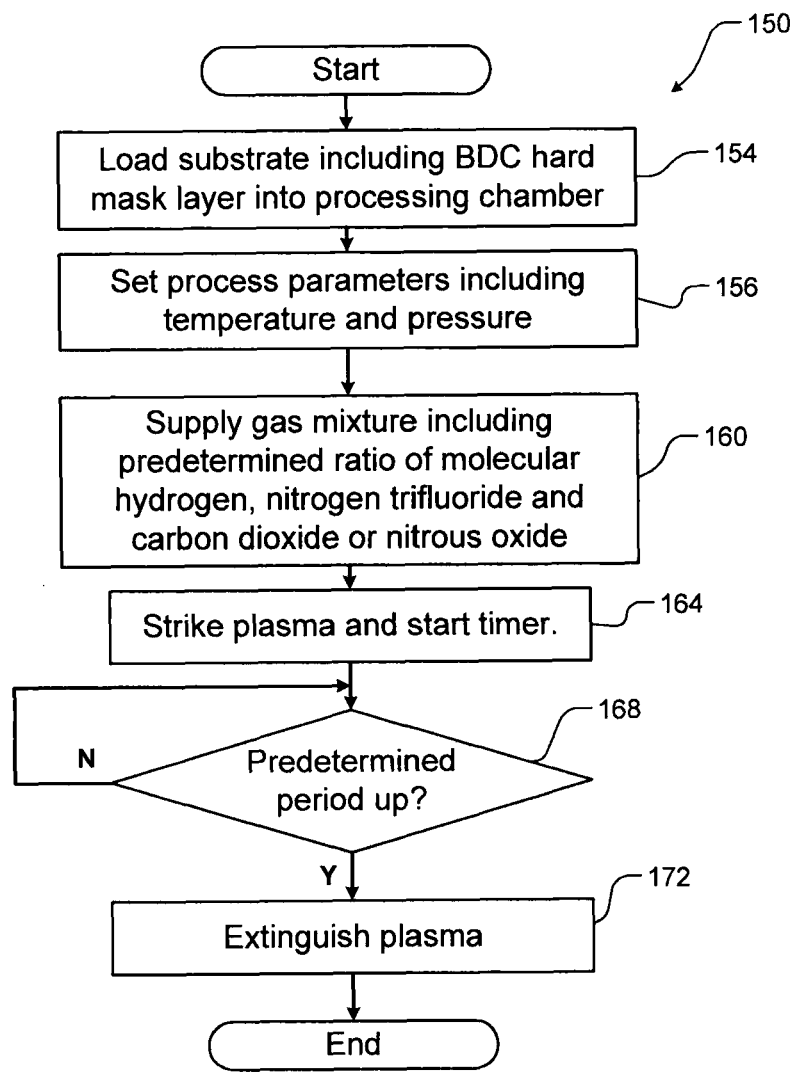
FIG. 4 is a flowchart of an example of a method for removing the BDC hard mask layer from the substrate.

Referring now to FIG. 4, a method 150 for removing the BDC hard mask layer is shown. At 154, the substrate is loaded onto the substrate support in a processing chamber. The substrate includes the BDC hard mask layer and one or more underlying layers. In some examples, the controller controls the process temperature and pressure, supplies a plasma gas mixture, strikes plasma and extinguishes the plasma. At 156, process parameters such as temperature and pressure are set to predetermined values.

At 160, the plasma gas mixture including a predetermined ratio of $H_2$, $NF_3$, and at least one gas selected from a group consisting of $CO_2$ and $N_2O$ is supplied to the processing chamber. At 164, the plasma is supplied to the processing chamber or struck in the processing chamber and a timer is started. The plasma is maintained for a predetermined stripping period. At 168, if the predetermined stripping period for the BDC hard mask layer ends, the plasma is extinguished at 172. The substrate may optionally remain in or is removed from the processing chamber and further processing of the substrate may be performed.

In some examples, the plasma gas mixture includes 1% to 25% $CO_2$ or $N_2O$, 0.5% to 10% $NF_3$ and 65% to 98.5% $H_2$, although other gas mixtures may be used. In other examples, the plasma gas mixture includes 2% to 8% $CO_2$ or $N_2O$, 0.833% to 3.33% $NF_3$ and 88.66% to 97.66% $H_2$, although other mixtures may be used. In one example, gas flows as a % of total gas flow are 94.33% $H_2$, 4% $CO_2$ or $N_2O$ and 1.67% $NF_3$. In some examples, the process temperature is in a range from 100° C. to 300° C. during stripping, although other process temperatures may be used. In other examples, the process temperature is in a range from 140° C. to 160° C. for residue removal, although other process temperatures may be used. In still other examples, the process temperature is about 150° C. for residue removal (e.g. 145° C. to 155° C.). In other examples, the process temperature is in a range from 235° C. to 265° C. for ashing, although other process temperatures may be used.

In some examples, boron doping of the hard mask layer is in a range from 5% to 80%, although other doping levels may be used. In some examples, boron doping of the hard mask layer is in a range from 10% to 45%, although other doping levels may be used. In some examples, chamber pressure is in a range from 250 mTorr to 1000 mTorr, although other pressures may be used. In some examples, chamber pressure is in a range from 450 mTorr to 550 mTorr, although other pressures may be used. In some examples, chamber pressure is about 500 mTorr (e.g. 480 mTorr to 520 mTorr). In some examples, the RF power is in a range from 1000 W to 4500 W, although other RF power levels may be used. In some examples, the RF power is 2750 W to 3250 W.

In some examples, stripping the BDC hard mask layer using the substrate processing systems and methods described herein may have greater than or equal to 100:1 selectivity to underlying oxide, nitride, PSG, BPSG, W, or WSi layers. In some examples, stripping the BDC hard mask layer using the systems and methods described herein may have greater than or equal to 500:1 selectivity to underlying oxide, nitride, PSG, BPSG, W, or WSi layers. In other examples, stripping the BDC hard mask layer using the systems and methods described herein may have greater than or equal to 1000:1 selectivity to underlying oxide, nitride, PSG, BPSG, W, or WSi layers. In other examples, stripping the BDC hard mask layer using the systems and methods described herein may have 2500:1 selectivity to underlying oxide, nitride, PSG, BPSG, W, or WSi layers.

In some examples, the predetermined stripping period is in a range from 1 to 10 minutes, although other stripping periods may be used. Process time is dependent on the specific film being removed and relates to the percentage of boron doping, film thickness, deposition temperature and other things. In some examples, the ash rate is in a range from 100 nm/minute to 500 nm/minute.

In general, selectivity varies to a greater extent based on the percent of boron doping in the BDC hard mask, $NF_3$ flow and $H_2$ flow and to a lesser extent based on $N_2O$ or $CO_2$ flow rates. While the plasma gas mixtures including $N_2O$ or $CO_2$ strip the BDC hard mask with similar ash rates and selectivity, the plasma gas mixtures including N2O have improved ash rates of residue post etch.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method for processing a substrate, comprising:
    arranging a substrate including a film layer on a substrate support in a processing chamber, wherein the film layer includes a boron doped carbon hard mask;
    supplying a plasma gas mixture including molecular hydrogen gas, nitrogen trifluoride gas and a gas selected from a group consisting of carbon dioxide and nitrous oxide, wherein the plasma gas mixture includes 1% to 25% of the gas selected from a group consisting of carbon dioxide and nitrous oxide, 0.5% to 10% of the nitrogen trifluoride gas and 65% to 98.5% of the molecular hydrogen gas; and
    at least one of striking plasma in the processing chamber or supplying plasma to the processing chamber for a predetermined stripping period, wherein the plasma strips the film layer during the predetermined stripping period.

2. A method for processing a substrate, comprising:
    arranging a substrate including a film layer on a substrate support in a processing chamber, wherein the film layer includes a boron doped carbon hard mask;
    supplying a plasma gas mixture including molecular hydrogen gas, nitrogen trifluoride gas and a gas selected from a group consisting of carbon dioxide and nitrous oxide, wherein the plasma gas mixture includes 2% to 8% of the gas selected from a group consisting of carbon dioxide and nitrous oxide, 0.833% to 3.33% of the nitrogen trifluoride gas and 88.66% to 97.66% of the molecular hydrogen gas; and
    at least one of striking plasma in the processing chamber or supplying plasma to the processing chamber for a predetermined stripping period, wherein the plasma strips the film layer during the predetermined stripping period.

3. The method of claim 1, wherein a process temperature during the predetermined stripping period is in a range from 100° C. to 300° C.

4. The method of claim 1, wherein a process temperature during the predetermined stripping period is in a range from 140° C. to 160° C. during residue removal.

5. The method of claim 1, wherein boron doping of the film layer is in a range from 5% to 85%.

6. The method of claim 1, wherein pressure in the processing chamber is maintained in a range from 250 mTorr to 1000 mTorr during the predetermined stripping period.

7. The method of claim 1, wherein pressure in the processing chamber is maintained in a range from 450 mTorr to 550 mTorr during the predetermined stripping period.

8. The method of claim 1, wherein radio frequency (RF) plasma power is in a range from 1000 W to 4500 W.

9. The method of claim 1, wherein radio frequency (RF) plasma power is in a range from 2750 W to 3250 W.

10. The method of claim 1, wherein the film layer is arranged on a second film layer and the stripping of the film layer has a selectivity ratio to the second film layer that is greater than 100:1.

11. The method of claim 1, wherein the film layer is arranged on a second film layer and the stripping of the film layer has a selectivity ratio to the second film layer that is greater than 500:1.

12. The method of claim 1, wherein the film layer is arranged on a second film layer and the stripping of the film layer has a selectivity ratio to the second film layer that is greater than 1000:1.

13. The method of claim 1, wherein the film layer is arranged on a second film layer and the second film layer includes one of an oxide film layer and a nitride film layer.

14. The method of claim 1, wherein the film layer is arranged on a second film layer and the second film layer includes one of borophosphosilicate glass (BPSG), phosphosilicate glass (PSG), tungsten (W) or tungsten silicide (WSi).

15. The method of claim 1, wherein an ashing rate during the predetermined stripping period is in a range from 100 nm/minute to 500 nm/minute.

16. The method of claim 1, wherein the processing chamber includes;
    an upper chamber surrounded by an inductive coil;
    a lower chamber including the substrate support; and
    a gas dispersion device arranged between the upper chamber and the lower chamber.

17. The method of claim 1, wherein a process temperature during the predetermined stripping period is in a range from 235° C. to 265° C. during ashing.

* * * * *